(12) United States Patent
Jang et al.

(10) Patent No.: US 11,228,335 B2
(45) Date of Patent: Jan. 18, 2022

(54) METHOD AND APPARATUS FOR ADJUSTING SIGNAL LEVEL IN WIRELESS COMMUNICATION SYSTEM

(71) Applicant: Samsung Electronics Co., Ltd., Suwon-si (KR)

(72) Inventors: Jaesik Jang, Suwon-si (KR); Kyuhwan An, Suwon-si (KR); Youngchang Yoon, Suwon-si (KR); Kihyun Kim, Suwon-si (KR); Sangho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/727,438

(22) Filed: Dec. 26, 2019

(65) Prior Publication Data

US 2020/0212952 A1    Jul. 2, 2020

(30) Foreign Application Priority Data

Dec. 26, 2018    (KR) .......................... 10-2018-0169147

(51) Int. Cl.
*H04B 1/403*    (2015.01)
*H03F 3/24*    (2006.01)
*H03F 3/45*    (2006.01)
*H04B 1/00*    (2006.01)
*H04B 1/28*    (2006.01)

(52) U.S. Cl.
CPC ............... *H04B 1/406* (2013.01); *H03F 3/24* (2013.01); *H03F 3/456* (2013.01); *H04B 1/005* (2013.01); *H04B 1/28* (2013.01)

(58) Field of Classification Search
CPC ...................... H04B 2001/0491; H04B 1/1607
See application file for complete search history.

(56) References Cited

U.S. PATENT DOCUMENTS

| 5,724,005 A | 3/1998 | Chen et al. |
| 7,092,692 B2 * | 8/2006 | Tan ...................... H03D 7/1441 327/530 |
| 8,686,736 B2 | 4/2014 | Forstner |

(Continued)

FOREIGN PATENT DOCUMENTS

| DE | 102012201990 A1 | 8/2013 |
| EP | 1350332 A2 | 10/2003 |

OTHER PUBLICATIONS

Kim et al, "Intermodulation analysis of Dual-Gate FET Mixers", IEEE Transactions on Microwave Theory and Techniques, vol. 50, No. 6, Jun. 1, 2002.

(Continued)

*Primary Examiner* — Wen W Huang
(74) *Attorney, Agent, or Firm* — Jefferson IP Law, LLP

(57) ABSTRACT

A method and apparatus capable of adjusting a signal level in a wireless communication system are provided. An electronic device includes an oscillator configured to output a local oscillator (LO) signal, a mixer configured to convert a frequency band of a first signal based on the LO signal and output a third signal, and a feedback circuit configured to output a feedback signal for adjusting a magnitude of the LO signal, wherein the mixer is further configured to adjust a magnitude of LO signal based on the feedback signal.

14 Claims, 18 Drawing Sheets

| Address | Process | Voltage (V) | Temperature (°C) | Range of LO power [dbm] |
|---|---|---|---|---|
| @ 0x01 | Slow | 0.85 | 125 | [ -7 : -3 ] |
| @ 0x02 | Fast | 0.95 | -40 | [ -13 : -9 ] |
| @ 0x03 | Typ | 0.9 | 50 | [ -10 : -6 ] |
| ... | | | | |

(56) References Cited

U.S. PATENT DOCUMENTS

| | | | |
|---|---|---|---|
| 8,977,211 B1* | 3/2015 | Tinella | H04B 17/0085 455/67.11 |
| 9,154,079 B2 | 10/2015 | Zhuo et al. | |
| 10,135,472 B1* | 11/2018 | Ashry Othman | H04B 1/0475 |
| 2004/0048588 A1* | 3/2004 | Ammar | H04B 7/18517 455/130 |
| 2006/0009171 A1* | 1/2006 | Xu | H04B 1/0475 455/114.2 |
| 2007/0149152 A1* | 6/2007 | Hsiao | H04B 1/0475 455/127.2 |
| 2007/0243846 A1* | 10/2007 | Kirisawa | H03D 7/00 455/317 |
| 2008/0287076 A1* | 11/2008 | Shen | H04B 1/0475 455/114.3 |
| 2009/0174456 A1* | 7/2009 | Yanagisawa | H04B 1/0475 327/307 |
| 2011/0053547 A1* | 3/2011 | Yahav | H03D 7/00 455/317 |
| 2011/0105060 A1* | 5/2011 | Kim | H04B 1/04 455/127.1 |
| 2011/0275341 A1* | 11/2011 | Landmark | H04B 1/109 455/318 |
| 2012/0140852 A1* | 6/2012 | Kato | H03F 3/189 375/298 |
| 2013/0029626 A1* | 1/2013 | Chen | H04B 15/04 455/334 |
| 2013/0223488 A1* | 8/2013 | Kim | H04B 1/403 375/219 |
| 2013/0259102 A1* | 10/2013 | Gudem | H04B 1/3805 375/219 |
| 2014/0103991 A1 | 4/2014 | Iyengar et al. | |
| 2017/0230920 A1* | 8/2017 | Shwartz | H04W 52/52 |
| 2017/0359029 A1 | 12/2017 | Nobbe et al. | |
| 2018/0159474 A1* | 6/2018 | Yu | H03D 7/1441 |

OTHER PUBLICATIONS

Fager et al., "A Comprehensive Analysis of IMD Behavior in RF CMOS Power Amplifier", IEEE Journal of Solid State Circuits, vol. 39, No. 1, Jan. 1, 2004.

Extended European Search Report dated Apr. 28, 2020, issued in a counterpart European Application No. 19219682.2-1220.

* cited by examiner

Current consumption (mA) of Mixer switch
versus buffer LO input power (dBm)

IM3 (dBm) versus buffer LO input power (dBm)

Conversion Gain(dB) versus
buffer LO input power (dBm)

Switching quad current consumption (mA) versus LO input power (dBm)

IM3 (dBm) versus LO input power (dBm)

Conversion Gain(dB) versus LO input power (dBm)

FIG. 10

| Address | Process | Voltage [V] | Temperature [°C] | Range of LO power [dbm] |
|---------|---------|-------------|------------------|-------------------------|
| @ 0x01  | Slow    | 0.85        | 125              | [-7 : -3]               |
| @ 0x02  | Fast    | 0.95        | -40              | [-13 : -9]              |
| @ 0x03  | Typ     | 0.9         | 50               | [-10 : -6]              |
| ...     |         |             |                  |                         |

METHOD AND APPARATUS FOR ADJUSTING SIGNAL LEVEL IN WIRELESS COMMUNICATION SYSTEM

CROSS-REFERENCE TO RELATED APPLICATION(S)

This application is based on and claims priority under 35 U.S.C. § 119(a) of a Korean patent application number 10-2018-0169147, filed on Dec. 26, 2018, in the Korean Intellectual Property Office, the disclosure of which is incorporated by reference herein in its entirety.

BACKGROUND

1. Field

The disclosure relates to an apparatus and a method for sensing a change in a signal level and adjusting the same.

2. Description of Related Art

In order to meet wireless data traffic demands that have increased after 4th generation (4G) communication system commercialization, efforts to develop an improved 5th generation (5G) communication system or a pre-5G communication system have been made. For this reason, the 5G communication system or the pre-5G communication system is called a beyond 4G network communication system or a post long term evolution (LTE) system. In order to achieve a high data transmission rate, an implementation of the 5G communication system in a mmWave band (for example, 60 GHz band) is being considered. In the 5G communication system, technologies such as beamforming, massive multiple-input and multiple-output (MIMO), Full Dimensional MIMO (FD-MIMO), array antenna, analog beam-forming, and large scale antenna are being discussed as means to mitigate a propagation path loss in the mm Wave band and increase a propagation transmission distance. Further, the 5G communication system has developed technologies such as an evolved small cell, an advanced small cell, a cloud Radio Access Network (RAN), an ultra-dense network, Device to Device communication (D2D), a wireless backhaul, a moving network, cooperative communication, Coordinated Multi-Points (CoMP), and received interference cancellation to improve the system network. In addition, the 5G system has developed Advanced Coding Modulation (ACM) schemes such as Hybrid frequency shift keying (FSK) and quadrature amplitude modulation (QAM) Modulation (FQAM) frequency and Sliding Window Superposition Coding (SWSC), and advanced access technologies such as Filter Bank Multi Carrier (FBMC), Non Orthogonal Multiple Access (NOMA), and Sparse Code Multiple Access (SCMA).

Meanwhile, the Internet has evolved into an Internet of Things (IoT) network in which distributed components such as objects exchange and process information from a human-oriented connection network in which humans generate and consume information. An Internet of Everything (IoE) technology in which a big data processing technology through a connection with a cloud server or the like is combined with the IoT technology has emerged. In order to implement IoT, technical factors such as a sensing technique, wired/wireless communication, network infrastructure, service-interface technology, and security technology are required, and research on technologies such as a sensor network, Machine-to-Machine (M2M) communication, Machine-Type Communication (MTC), and the like for connection between objects has recently been conducted.

In an IoT environment, an intelligent Internet Technology (IT) service that collects and analyzes data generated from connected objects and creates new value in peoples' lives may be provided. The IoT may be applied to fields such as those of a smart home, a smart building, a smart city, a smart car, a connected car, a smart grid, health care, a smart home appliance, or high-tech medical services through the convergence of the IT and various industries.

When wireless communication is performed in a high frequency band as in a 5G system, there is an increasing importance of technology for processing transmitted/received wireless signals. An example thereof may be a technology for converting a wireless signal received through a high frequency band to a signal in a low frequency band, or converting a signal in a low frequency band to a signal in a high frequency band for transmission.

In the case of an electronic device, in order to convert the frequency band of a signal, a predetermined local oscillator (LO) signal may be applied to the signal such that the frequency band is converted. The LO signal may undergo an abrupt change in the signal level due to a process-related change that may occur, or as a result of an influence of the supplied voltage or temperature. This may cause a sizable error in the process of processing the signal, the frequency band of which is to be converted.

Technologies for reducing such an error have been able to adjust the signal level only based on the direct current (DC), through a structure such as a mirroring circuit, but have limited application to adjustment of an abruptly changing signal level. Particularly, in the case of a system using a high frequency band (for example, 5G), a serious problem may occur to signal processing and communication results. Accordingly, there has been an increasing demand for more precise adjustment of the LO signal level that changes abruptly.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a method and an apparatus for adjusting the level of a changed local oscillator (LO) signal more precisely.

Additional aspects will be set forth in part in the description which follows and, in part, will be apparent from the description, or may be learned by practice of the presented embodiments.

In accordance with an aspect of the disclosure, an electronic device in a wireless communication system is provided. The electronic device includes a mixer to which a first signal is inputted, an oscillation unit configured to output a second signal for converting a frequency band of the first signal to the mixer, and a signal level control unit configured to extract the second signal outputted from the oscillation unit, between the oscillation unit and the mixer, and to output a control signal for adjusting a changed signal level of the extracted second signal to the oscillation unit, wherein the mixer is configured to generate, if a third signal adjusted from the second signal is received from the oscillation unit, a fourth signal converted from the inputted first signal, based on the third signal.

In accordance with another aspect of the disclosure, a method of an electronic device in a wireless communication system is provided. The method includes inputting a first signal, outputting a second signal for converting a frequency band of the first signal, extracting the outputted second signal from a transmission path of the second signal, outputting a control signal for adjusting a changed signal level of the extracted second signal, and generating, if a third signal adjusted from the second signal is outputted, a fourth signal converted from the inputted first signal, based on the third signal.

An embodiment is advantageous in that, by adjusting a change in the LO signal level resulting from the process, voltage, and temperature (PVT) more precisely, errors that may occur in the signal conversion process can be reduced.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 10 is a diagram illustrating an example of a lookup table enumerating ranges of signal levels with regard to respective PVT states according to an embodiment of the disclosure.

Throughout the drawings, like reference numerals will be understood to refer to like parts, components, and structures.

DETAILED DESCRIPTION

Figure 1:
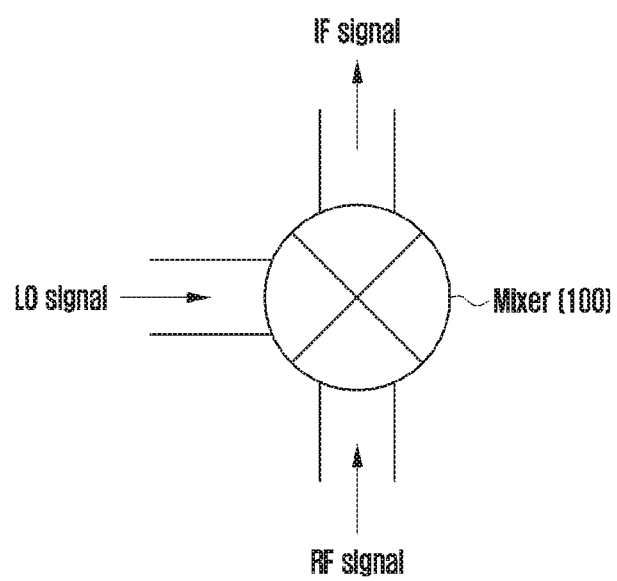
FIG. 1 is a diagram illustrating a schematic structure of a mixer according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In addition, in describing the embodiments of the disclosure, a main substance of the disclosure may be applied to even other communication systems that have a similar technical background with a little change in a range that is not largely out of the range of the disclosure, and this may be possible by a determination of a person having a skilled technical knowledge in a technical field of the disclosure.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

Here, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks.

These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks.

The computer program instructions may also be loaded onto a computer or other programmable data processing apparatus to cause a series of operation to be performed on the computer or other programmable apparatus to produce a computer implemented process such that the instructions that execute on the computer or other programmable apparatus provide operations for implementing the functions specified in the flowchart block or blocks.

And each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used herein, the "unit" refers to a software element or a hardware element, such as a Field Programmable Gate Array (FPGA) or an Application Specific Integrated Circuit (ASIC), which performs a predetermined function. However, the "unit does not always have a meaning limited to software or hardware. The "unit" may be constructed either to be stored in an addressable storage medium or to execute one or more processors.

Therefore, the "unit" includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the "unit" may be either combined into a smaller number of elements, "unit" or divided into a larger number of elements, "unit". Moreover, the elements and "units" may be implemented to reproduce one or more central processing units (CPUs) within a device or a security multimedia card.

Hereinafter, a method and an apparatus for adjusting the level of a signal according to an embodiment will be described in more detail with reference to the accompanying drawings.

FIG. 1 is a diagram illustrating a schematic structure of a mixer according to an embodiment of the disclosure.

Referring to FIG. 1, a mixer is a circuit configured to acquire one output signal from at least two kinds of inputted signals. For example, the mixer may perform an operation of applying an inputted second signal to an inputted first signal such that the first signal is converted to a signal in a higher frequency band and then outputted, or converted to a signal in a lower frequency band and then outputted.

Referring to FIG. 1, two kinds of signals may be inputted to the mixer 100. In FIG. 1, for example, a radio frequency (RF) signal and a local oscillator (LO) signal may be inputted to the mixer 100. In an embodiment, the LO signal may be applied to another signal inputted to the mixer and thus used to generate an output signal.

That is, if an RF signal and an LO signal are inputted to the mixer 100 in FIG. 1, the mixer 100 may apply the LO signal to the RF signal such that the RF signal in a high frequency band is converted to an intermediate frequency (IF) signal in a lower frequency band, and may output the IF signal. Although a mixer 100 is illustrated in FIG. 1, based on a case in which a wireless signal has been received, such that an RF signal is inputted thereto, and an IF signal is outputted therefrom, the same is applicable to the opposite case in which an IF signal is inputted thereto, and an RF signal is outputted therefrom.

As described above, the mixer applies an LO signal to an inputted signal so as to generate an output signal and, in order to acquire a desired output signal, an ideal LO signal needs to be applied to the input signal. The ideal LO signal has the shape of a square wave, but a sine wave having a high amplitude level may be used because, in the case of an actual circuit, the influence of an element such as a gate or capacitance is not negligible. However, such an LO signal may undergo an abrupt change in the signal level in various environments. Particularly, when applied to a signal in a high frequency band, the same may change more sensitively to various environments.

Figure 2:
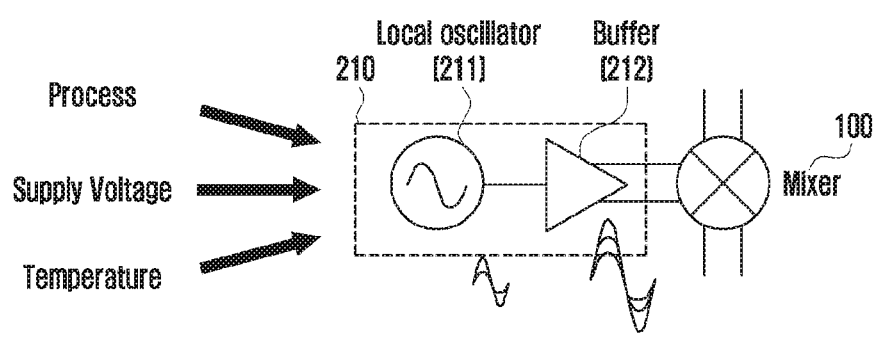
FIG. 2 is a diagram illustrating a process, voltage, and temperature (PVT) state that influences a local oscillator (LO) signal according to an embodiment of the disclosure.

FIG. 2 is a diagram illustrating a process, voltage, and temperature (PVT) state that influences an LO signal according to an embodiment of the disclosure.

Figure 3A:
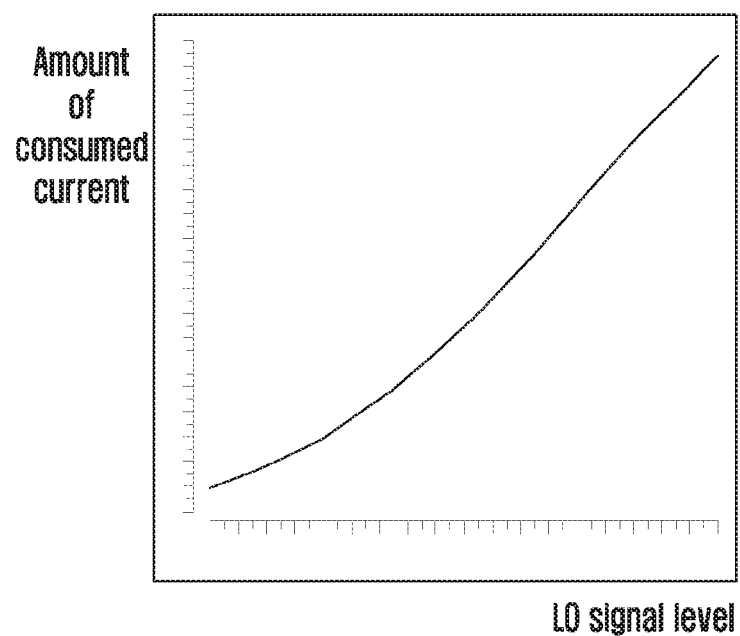
FIGS. 3A, 3B, and 3C are diagrams illustrating a change in LO signal levels according to a PVT state, according to various embodiments of the disclosure.
Figure 3B:
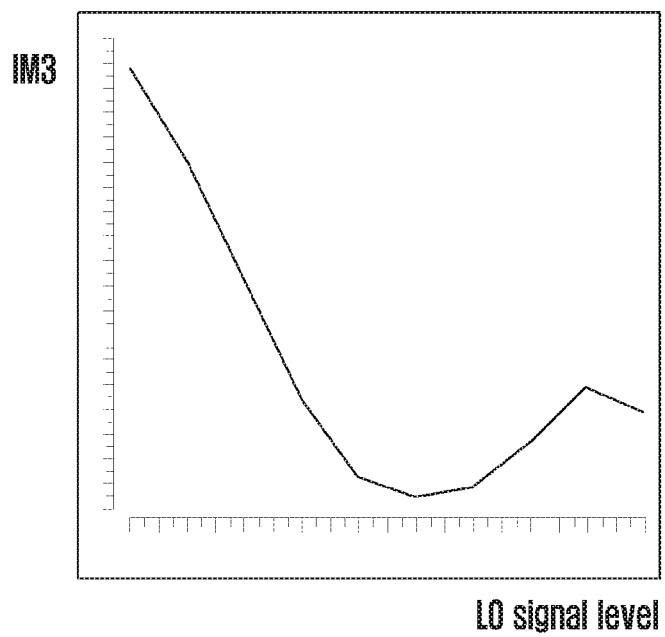
Figure 3C:
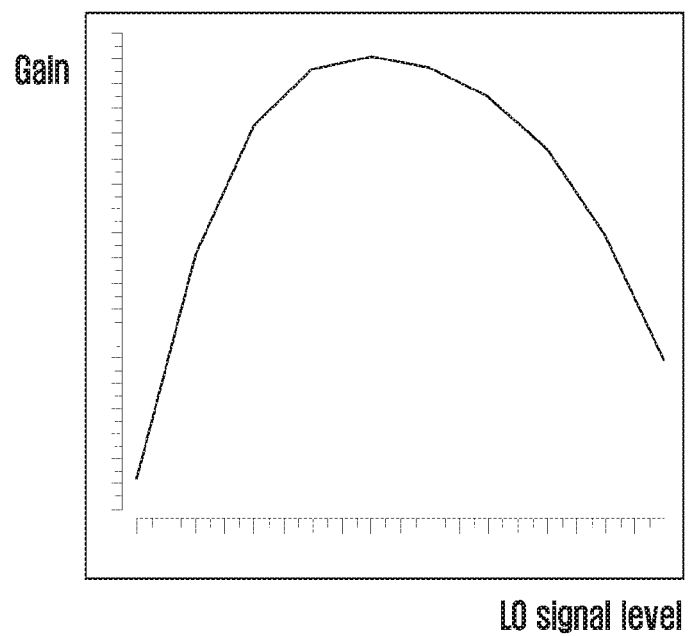

FIGS. 3A, 3B, and 3C are diagrams illustrating a change in LO signal levels according to a PVT state, according to various embodiments of the disclosure.

Referring to FIG. 2, the above-mentioned LO signal may be generated by an oscillation unit 210 according to an embodiment, and the oscillation unit 210 may include a local oscillator 211 and a buffer 212. In addition, the oscillation unit 210 may output the generated LO signal to a mixer, as illustrated in FIG. 2.

The local oscillator 211 according to an embodiment is configured to generate a local oscillation signal for signal frequency conversion, and the buffer 212 is configured to amplify the local oscillation signal so as to have a voltage value optimized for frequency conversion. In addition, the local oscillation signal amplified by the buffer 212 is inputted to the mixer as an LO signal, and is applied to convert the frequency of another signal inputted to the mixer.

Meanwhile, the LO signal generated in this manner may undergo an abrupt change in the signal level under various conditions. For example, the LO signal may change sensitively to a fabrication process-related change that may occur, to the voltage, and to the temperature. For convenience of description, factors that may influence the change in the LO signal level will hereinafter be referred to as PVT.

Referring to FIGS. 3A, 3B, and 3C, such an abrupt change in the LO signal level may influence the performance of the mixer that has received the same as an input. It can be confirmed, with reference to FIGS. 3A, 3B, and 3C, to what extent the performance of the mixer will vary as the LO signal level changes according to an embodiment of the disclosure. As the degree of the LO signal level change increases, the amount of current consumed by the mixer will change as illustrated in FIG. 3A, the value of a third order intercept and intermodulation product (IM3) will vary as illustrated in FIG. 3B, or the gain of the mixer will vary as illustrated in FIG. 3C.

Accordingly, if the LO signal level changes abruptly, the signal level is adjusted such that a desired signal can be outputted from the mixer.

Hereinafter, a method for sensing a change in the LO signal level and adjusting the same according to an embodiment will be described in more detail.

Figure 4:
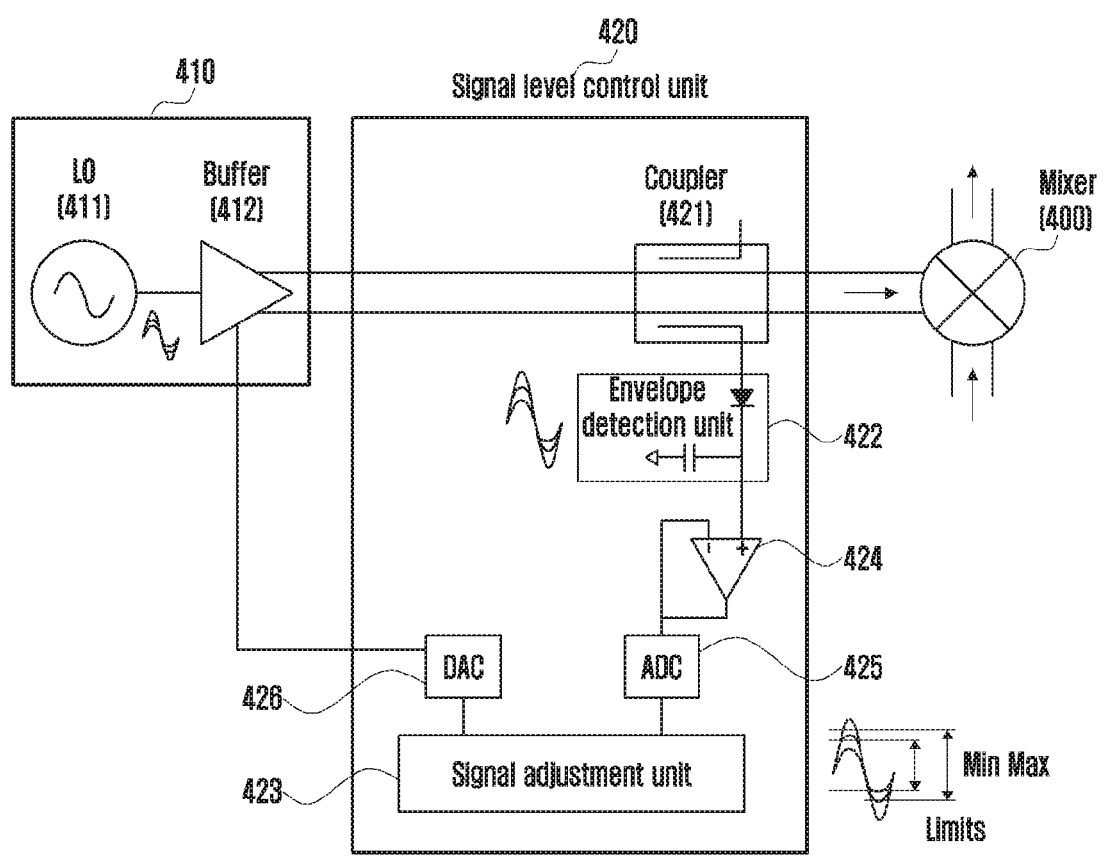
FIG. 4 is a diagram illustrating a configuration of an electronic device configured to adjust a signal level according to an embodiment of the disclosure.

FIG. 4 is a diagram illustrating a configuration of an electronic device configured to adjust a signal level according to an embodiment of the disclosure.

Referring to FIG. 4, the electronic device according to an embodiment may include a mixer 400, an oscillation unit 410, and a signal level control unit 420.

The mixer 400 according to an embodiment may receive at least two kinds of signals as inputs, as described with reference to FIG. 1, and may generate an output signal by using the same. For example, the two kinds of input signals may be an LO signal inputted from the oscillation unit 410 and an RF signal received through wireless communication. For convenience of description, another signal inputted to the mixer will hereinafter be referred to as a first signal, and the LO signal will be referred to as a second signal.

The oscillation unit 410 according to an embodiment may include a local oscillator 411 and a buffer 412 as described with reference to FIG. 2, may generate a second signal according to an embodiment, and may output the same to the mixer 400.

As described above, in order to acquire a signal to be outputted finally through the mixer, the electronic device proposed in the disclosure may further include a signal level control unit 420 for adjusting the level of the second signal between the mixer 400 and the oscillation unit 410, as illustrated in FIG. 4. The signal level control unit 420 may connect the oscillation unit 410 and the mixer 400 on the path of transmission of the second signal from the oscillation unit 410 to the mixer 400 as illustrated in FIG. 4. The signal level control unit 420 according to an embodiment may include a coupler 421, an envelope detection unit 422, a signal adjustment unit 423, and the like.

More specifically, the coupler 421 according to an embodiment may extract the second signal, which has been outputted toward the mixer 400 from the buffer 412 of the oscillation unit 410, on the path of transmission of the second signal. The second signal extracted by the coupler 421 in this manner may be delivered to the envelope detection unit 422 in order to sense whether or not the level of the second signal changes.

The envelope detection unit 422 according to an embodiment may be connected to the output end of the oscillation unit 410 by the coupler 421. The envelope detection unit 422 may detect an envelope for sensing the signal level range from the second signal delivered from the coupler 421. In the example illustrated in the diagram, the envelope detection unit 422 according to the disclosure may convert the detected envelope to an appropriate format more stably through an inverter 424 and an analog-to-digital converter (ADC) 425, which are connected thereto, and may deliver the same to the signal adjustment unit 423.

The signal adjustment unit 423 according to an embodiment may check the second signal's level range according to the detected envelope. In addition, the signal adjustment unit 423 may compare the checked second signal level range with a preconfigured signal level range and may generate an adjustment signal for adjusting the changed second signal level. The adjustment signal generated by the signal adjustment unit 423 may be inputted to the buffer 412 of the oscillation unit 410. Generation and output of a control signal according to an embodiment will be described later in more detail with reference to FIG. 5B.

According to an embodiment, a digital-to-analog converter (DAC) 426 may be further included between the signal adjustment unit 423 and the buffer 412 of the oscillation unit 410, as illustrated in FIG. 4, so as to convert the adjustment signal to bits of a control signal for adjusting the level of the second signal.

If the control signal is received from the signal adjustment unit 423, the oscillation unit 410 may adjust the level of the second signal based on the control signal. If a third signal is determined by appropriately adjusting the level of the second signal in this manner, the oscillation unit 410 may output the third signal to the mixer 400. If a signal completely adjusted from the second signal is received from the oscillation unit 410, the mixer 400 may apply the completely adjusted signal to the already-inputted first signal, thereby generating and outputting the signal to be originally outputted. For convenience of description, the signal completely adjusted from the second signal will hereinafter be referred to as a third signal, and the signal to be originally outputted by the mixer will be referred to as a fourth signal.

Hereinafter, a process of adjusting the level of a signal according to the first embodiment will be described in detail with reference to FIG. 4, FIG. 5A, FIG. 5B, and FIG. 5C.

Figure 5A:
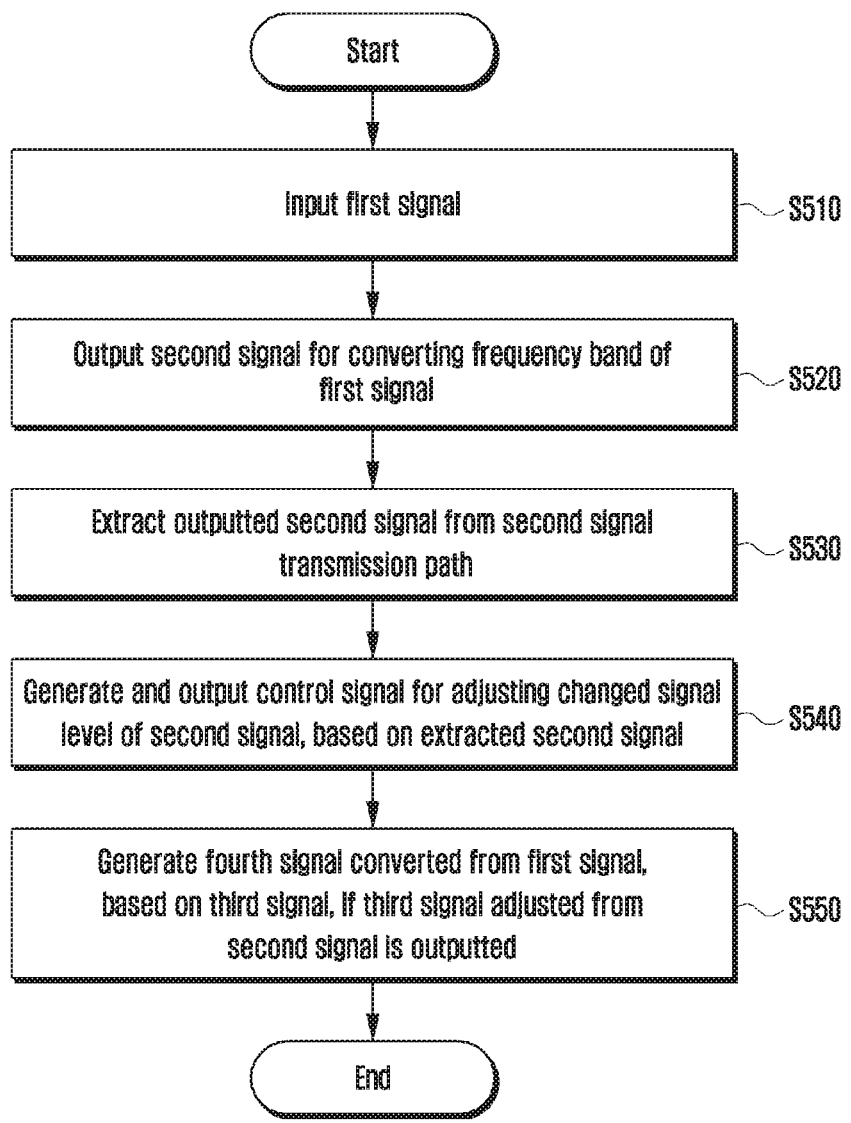
FIGS. 5A, 5B, and 5C are flowcharts illustrating a method for adjusting a signal level according to various embodiments of the disclosure.
Figure 5B:
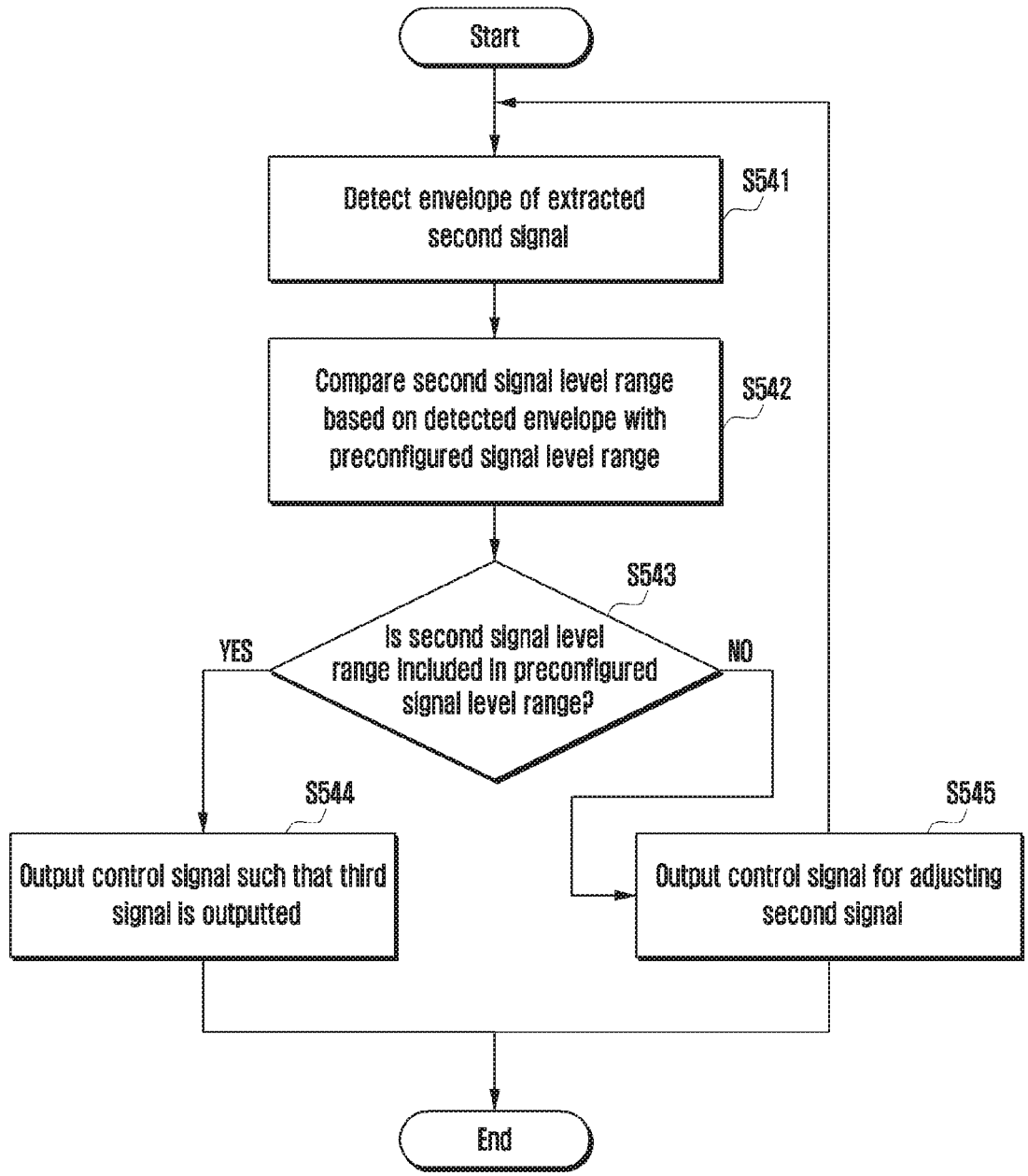
Figure 5C:
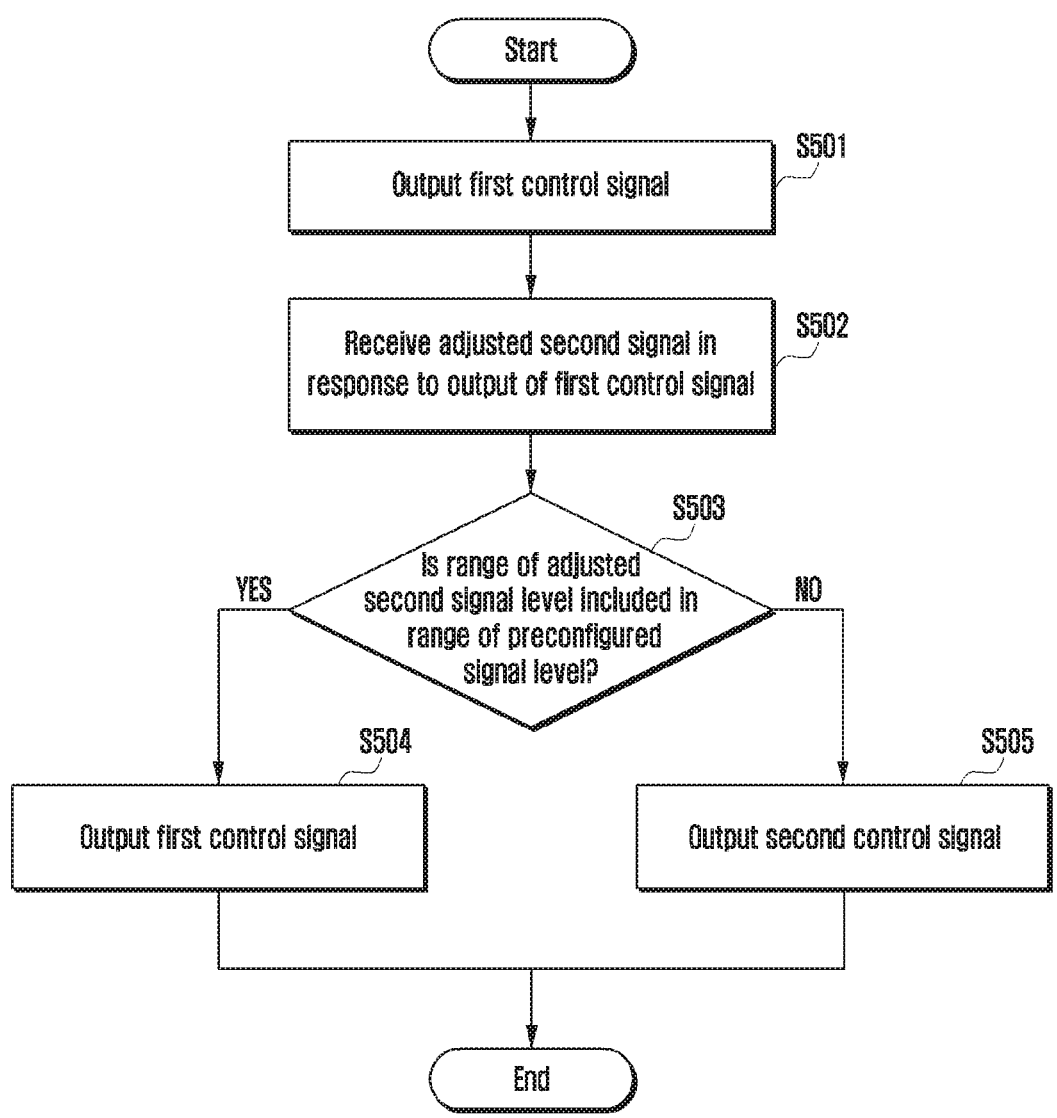

FIGS. 5A, 5B, and 5C are flowcharts illustrating a method for adjusting a signal level according to various embodiments of the disclosure.

Referring to FIG. 5A, a first signal may be inputted at operation S510. The first signal may be a signal inputted to the mixer 400 for frequency band conversion according to an embodiment.

In addition, a second signal for converting the frequency band of the first signal may be outputted at operation S520. The second signal may be an LO signal generated by the oscillation unit 410 according to an embodiment and outputted to the mixer 400 in order to convert the frequency band of the first signal.

If the second signal is outputted, the outputted second signal may be extracted from the second signal's transmission path at operation S530. For example, if the second signal is outputted to the mixer 400 from the oscillation unit 410, the coupler 421 included in the signal level control unit 420 according to an embodiment may extract the outputted second signal from the transmission path between the oscillation unit 410 and the mixer 400.

Based on the second signal extracted in this manner, a control signal for adjusting the changed signal level of the second signal may be generated and outputted at operation S540. A detailed process regarding generation and output of the control signal will now be described with reference to FIG. 5B.

Referring to FIG. 5B, an envelope may be detected from the extracted second signal at operation S541. For example, the second signal extracted from the coupler 421 according to an embodiment may be delivered to the envelope detection unit 422 such that an envelope for sensing the range of the second signal level may be detected. If the range of the second signal level is checked based on the detected envelope, an adjustment signal for adjusting the changed second signal level may be generated.

More specifically, the range of the second signal level based on the detected envelope may be compared with the range of a preconfigured signal level at operation S542. For example, the signal adjustment unit 423 according to an embodiment may check the maximum and minimum values of a second signal magnitude by using the detected envelope, may check the range of the second signal level therefrom, and may confirm whether or not the checked range of the second signal level is included in the range of the preconfigured signal level at operation S543.

If the range of the second signal level is included in the range of the preconfigured signal level, a control signal may be outputted such that a third signal for generating a fourth signal is outputted at operation S544.

More specifically, if the range of the second signal level is included in the range of the preconfigured signal level, the signal adjustment unit 423 according to an embodiment may confirm that the second signal level has not changed. In this case, the signal adjustment unit 423 may output a control signal for controlling the oscillation unit 410 so as to output a third signal, which has been completely adjusted from the second signal, to the mixer 400.

On the other hand, if range of the second signal level is not included in the range of the preconfigured signal level, a control signal for adjusting the second signal may be outputted at operation S545.

More specifically, if the range of the second signal level is not included in the range of the preconfigured signal level, the signal adjustment unit 423 according to an embodiment may generate a control signal such that the range of the changed second signal level is included in the range of the preconfigured signal level. In addition, the signal adjustment unit 423 may output the generated control signal to the oscillation unit 410. The oscillation unit 410 according to an embodiment may receive the control signal and may adjust the second signal by using the same.

Referring back to FIG. 5A, the oscillation unit 410 according to an embodiment may determine a third signal completely adjusted from the second signal, based on the control signal received from the signal level control unit 420, and may output the third signal toward the mixer.

If the third signal completely adjusted from the second signal is outputted in this manner, a fourth signal converted from the first signal may be generated based on the third signal at operation S550. That is, if the oscillation unit 410 according to an embodiment outputs a third signal completely adjusted from the second signal to the mixer, the mixer may apply the third signal to the already-inputted first signal, thereby generating a fourth signal that has undergone frequency band conversion from the first signal.

As described above, an embodiment is advantageous in that, even if the LO signal's level is changed by a PVT change, an LO signal suitable for generating the desired output signal can be inputted to the mixer because an element capable of controlling the changed LO signal level is provided on the path of transmission of the LO signal.

Meanwhile, if a second signal adjusted based on the control signal is outputted from the oscillation unit 410, the signal level control unit 420 according to an embodiment may confirm whether or not the second signal has been properly adjusted. This is because, if the signal level control unit 420 confirms that the second signal has been properly adjusted, a control signal needs to be generated such that a third signal is outputted from the oscillation unit to the mixer, but if it is determined that the second signal has not been properly adjusted, a control signal for readjusting the adjusted second signal needs to be generated.

Referring to FIG. 5C, a first control signal for adjusting the second signal may be outputted first at operation S501.

The signal level control unit 420 according to an embodiment may output a first signal to the oscillation unit 410 according to an embodiment, and the oscillation unit 410 may adjust the second signal, based on the first control signal. In addition, the oscillation unit 410 according to an embodiment may output the adjusted second signal.

Thereafter, the adjusted second signal may be received in response to output of the first control signal at operation S502. For example, the adjusted second signal may be extracted from the coupler 421 included in the signal level control unit 420 according to an embodiment, and may be delivered to the signal adjustment unit 423. If the adjusted second signal is received, the signal level control unit 420 may determine whether or not the adjusted second signal need to be readjusted.

More specifically, it may be confirmed whether or not the range of the adjusted second signal level is included in the range of a preconfigured signal level at operation S503.

If the range of the adjusted second signal level is included in the range of the preconfigured signal level, the signal level control unit 420 according to an embodiment needs to control the oscillation unit 410 such that the adjusted second signal is outputted from the oscillation unit 410 to the mixer 400 as a third signal. For example, the signal level control unit 420 according to an embodiment may output a first control signal at operation S504, which is identical to the first control signal that has been previously outputted to adjust the second signal, to the oscillation unit 410 such that the adjusted second signal is outputted from the oscillation unit 410 as a third signal.

In this case, if a control signal is received from the signal level control unit 420 in response to output of the adjusted second signal, the oscillation unit 410 of according to an embodiment may determine whether or not the control signal is equal to the previously received control signal. If the same control signal as the previously received first control signal is received, the oscillation unit 410 according to an embodiment may determine the second signal as a third signal, and may output the third signal to the mixer 400.

On the other hand, if the range of the adjusted second signal is not included in the range of the preconfigured signal level, the signal level control unit 420 according to an embodiment needs to control the oscillation unit 410 such that the adjusted second signal is readjusted. For example, the signal level control unit 420 according to an embodiment may generate a second control signal for readjusting the adjusted second signal such that the range of the adjusted second signal level is included in the range of the preconfigured signal level. In addition, the signal level control unit 420 according to an embodiment may output the generated second control signal to the oscillation unit 410 at operation S505.

In this case, if a control signal is received from the signal level control unit 420 in response to output of the adjusted second signal, the oscillation unit 410 according to an embodiment may determine whether or not the control signal is equal to the previously received control signal. If a second control signal different from the previously received first control signal is received, the oscillation unit 410 according to an embodiment may readjust the adjusted second signal based on the second control signal. The readjusted second control signal may be again outputted from the oscillation unit 410.

As described above, an embodiment is advantageous in that, even if an adjusted signal is outputted from the oscillation unit, it is reconfirmed if the adjusted signal has been properly adjusted, and the same is readjusted, thereby making it possible to adjust the abruptly changing LO signal level more precisely and accurately.

Meanwhile, the PVT state not only influences the LO signal level, but also may influence the performance of the mixer. Hereinafter, a method for adjusting the LO signal level in view of a change in the mixer performance, which follows the PVT state, will be described.

Figure 6A:
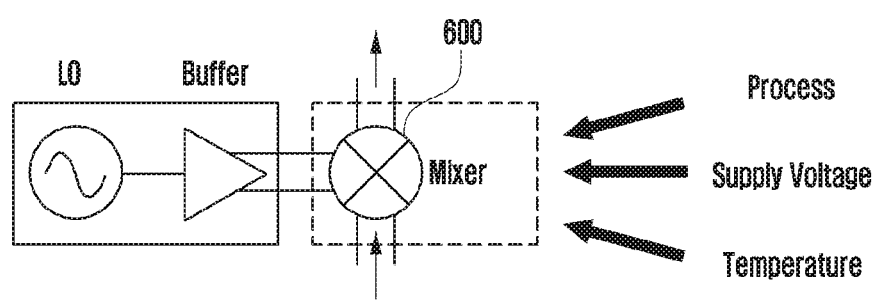
FIGS. 6A and 6B are diagrams illustrating a PVT state that influences a mixer according to various embodiments of the disclosure.
Figure 6B:
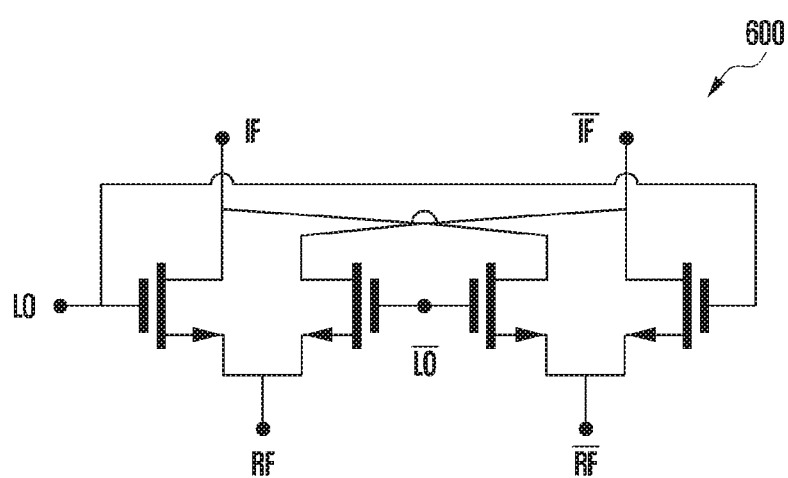

FIGS. 6A and 6B are diagrams illustrating a PVT state that influences a mixer according to various embodiments of the disclosure.

Figure 7A:
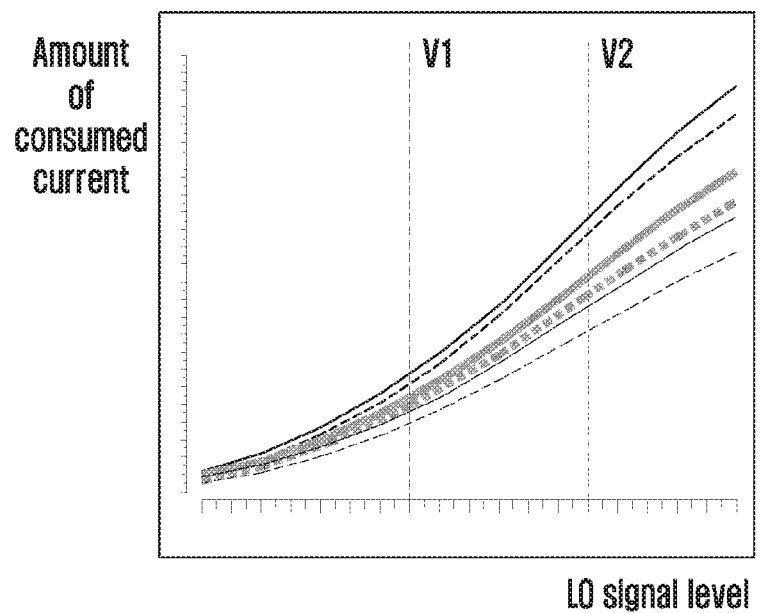
FIGS. 7A, 7B, and 7C are diagrams illustrating a change in the mixer performance according to the PVT state, according to various embodiments of the disclosure.
Figure 7B:
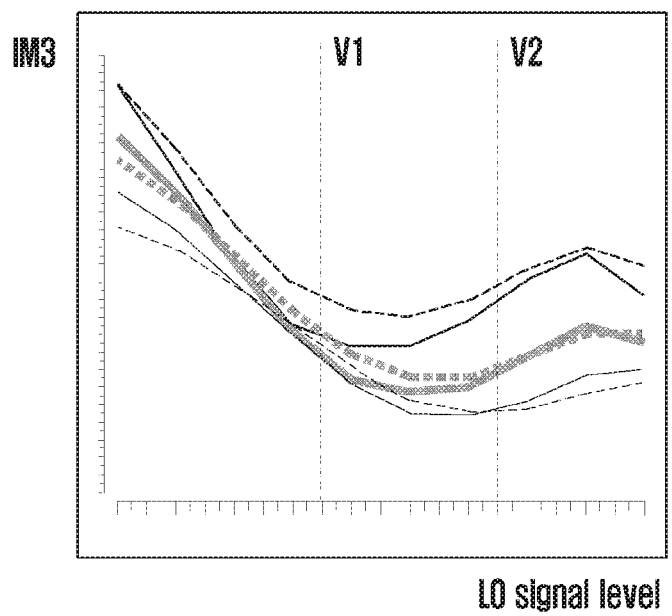
Figure 7C:
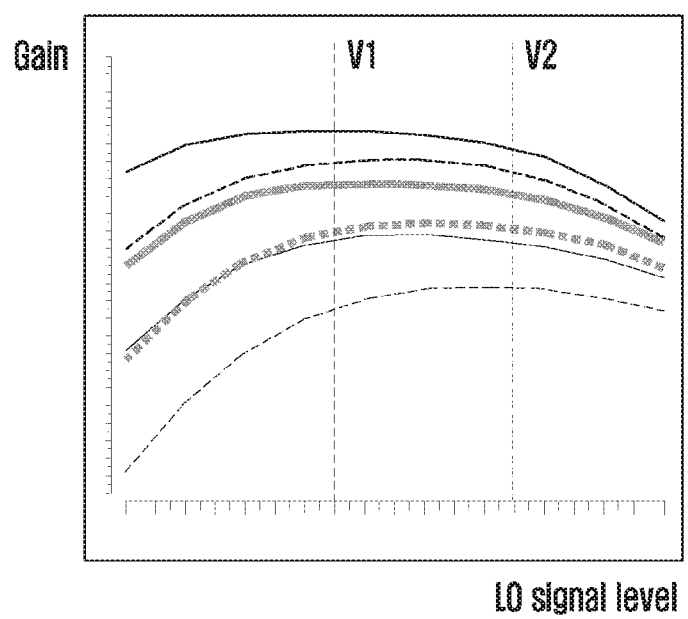

FIGS. 7A through 7C are diagrams illustrating a change in the mixer performance according to on the PVT state, according to various embodiments of the disclosure.

Referring to FIG. 6A, the performance of a mixer 600 according to an embodiment may change depending on a process-related change that may occur, the supplied voltage, and the temperature. The mixer 600 according to an embodiment may be configured as illustrated in FIG. 6B, for example.

The mixer according to an embodiment may be a double balanced active mixer as illustrated in FIG. 6B, for example. This is advantageous in that, when processing a signal in a high-frequency band as in a 5G system, leak of the LO signal can be prevented, and loss thereof can be reduced. However, elements included in the mixer, such as a switching transistor and the like, may undergo a change in the unique characteristics thereof due to the PVT state.

Referring to FIGS. 7A, 7B, and 7C, that various results can be derived, according to the PVT state, regarding the performance of the mixer that depends on a change in the LO signal level. In respective graphs of FIGS. 7A, 7B, and 7C, line thicknesses may denote different temperatures, and line types may denote different process types.

For example, as in FIG. 7A, the degree of increase in the amount of current consumed by the mixer, as the degree of the LO signal level change increases, may be differently derived depending on the process type or temperature. Likewise, it can be understood that, in FIG. 7B and FIG. 7C, different results regarding the IM3 or gain, which depends on a change in the LO signal level, may be derived as the process type and the temperature vary.

As such, the PVT state not only influences the change in the LO signal level itself, but also changes the characteristics of elements constituting the mixer, and thus may pose a problem of changing the mixer performance. Accordingly, a method capable of adjusting the LO signal level more appropriately by additionally considering a change in the mixer performance, which depends on the PVT state, according to another embodiment will be described.

Figure 8:
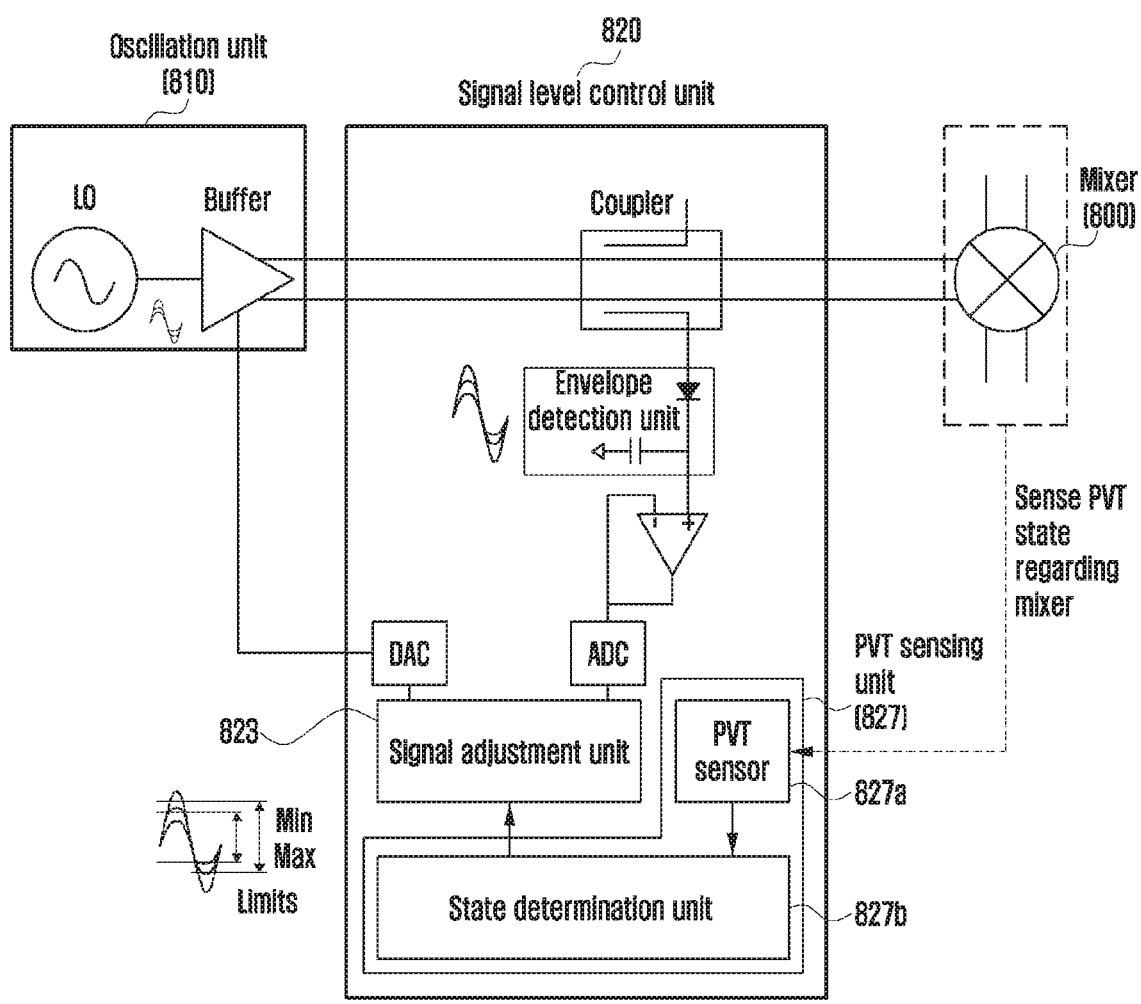
FIG. 8 is a diagram illustrating a configuration of an electronic device configured to adjust a signal level according to an embodiment of the disclosure.

FIG. 8 is a diagram illustrating a configuration of an electronic device configured to adjust a signal level according to an embodiment of the disclosure.

Figure 9:
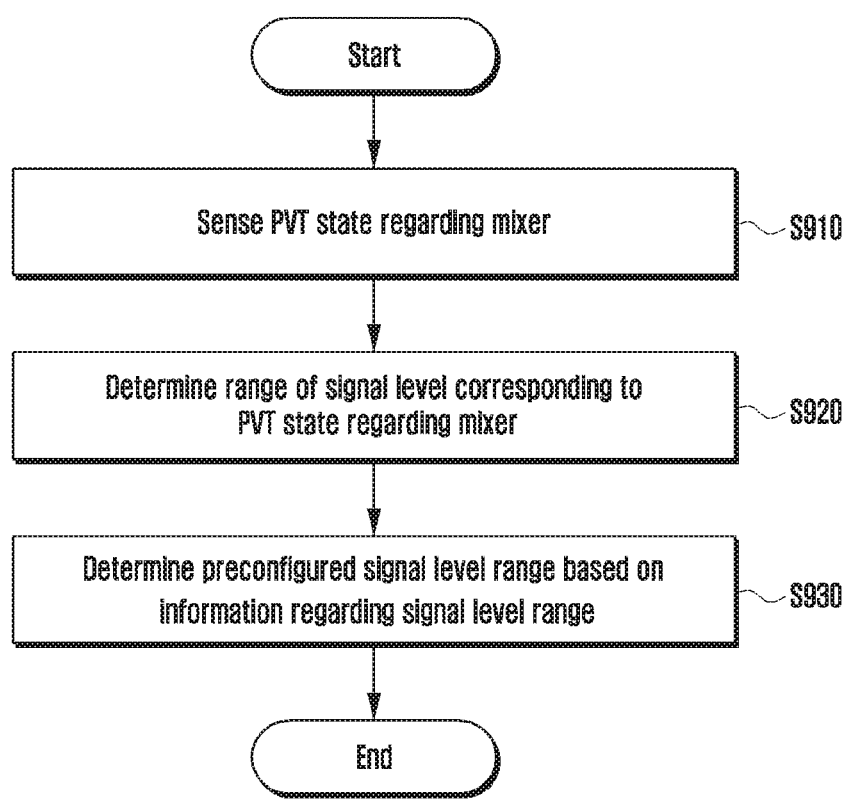
FIG. 9 is a flowchart illustrating a method for determining a range of a signal level according to an embodiment of the disclosure.

FIG. 9 is a flowchart illustrating a method for determining a range of a signal level according to an embodiment of the disclosure.

FIG. 10 is a diagram illustrating an example of a lookup table enumerating ranges of signal levels with regard to respective PVT states according to an embodiment of the disclosure. Repeated descriptions of elements identical to those described above will be omitted herein.

Referring to FIG. 8, the electronic device according to an embodiment may include, in order to adjust a signal level, a mixer 800, an oscillation unit 810, and a signal level control unit 820. The signal level control unit 820 according to an embodiment may further include a PVT sensing unit 827 capable of sensing a PVT state regarding the mixer 800.

The PVT sensing unit 827 according to an embodiment may sense the PVT state regarding the mixer and may provide information to the signal adjustment unit 823 such that the changed mixer performance is accordingly reflected in adjustment of the LO signal level. As used herein, the information may refer to information regarding the range of a signal level that serves as a reference used by the signal adjustment unit 823 to confirm whether or not the LO signal level changes. This will be described later in more detail with reference to FIG. 9 and FIG. 10.

The PVT sensing unit 827 according to an embodiment may further include a PVT sensor 827a and a state determination unit 827b. The PVT sensor 827a according to an embodiment may include at least one sensor for sensing the PVT state regarding the mixer 800. For example, the PVT sensor 827a according to an embodiment may include a process sensor for sensing a process-related change that may occur, a temperature sensor capable of sensing the temperature of the mixer, a sensor capable of measuring the supplied voltage, and the like.

If the PVT sensor 827a senses the PVT state regarding the mixer in this manner, the sensed PVT state may be delivered to the state determination unit 827b. The state determination unit 827b according to an embodiment may provide information regarding the range of a reference signal level corresponding to the mixer's performance and state to the signal adjustment unit 823 such that the mixer performance changed according to the PVT state can be used to adjust the LO signal level.

Referring to FIG. 9, the PVT state regarding the mixer performance is sensed at operation S910, and if the sensed PVT state is delivered, the range of a signal level corresponding to the PVT state regarding the mixer may be determined at operation S920.

For example, the range of the signal level corresponding to the PVT state regarding the mixer may be determined based on a lookup table. For example, as illustrated in FIG. 10, sensed PVT states may be mapped onto information regarding ranges of signal levels reflecting the mixer performance depending on the same, respectively, thereby constituting a lookup table. The state determination unit 827b according to an embodiment may check signal level range information corresponding to a PVT state acquired from the PVT sensor 827a, based on the lookup table.

If the signal level range corresponding to the PVT state is determined in this manner, information regarding the determined signal level range may be delivered to the signal adjustment unit 823 from the state determination unit 827b. Thereafter, the signal adjustment unit 823 may use the signal level range information received from the state determination unit 827b in order to confirm whether or not the second signal's level changes.

That is, a preconfigured signal level range may be determined based on the signal level range information at operation S930. If a second signal is extracted from the oscillation unit 810, the range of the extracted second signal may be compared with the determined signal level range, thereby outputting a control signal for adjusting the second signal.

For example, the signal adjustment unit 823 according to an embodiment may adjust the second signal with reference to the range of the preconfigured first signal level. If the mixer performance has changed due to the PVT state, the PVT sensing unit 827 according to an embodiment may provide information regarding the range of a second signal level reflecting the changed mixer performance to the signal adjustment unit 823. Thereafter, the signal adjustment unit 823 may change the first signal level range to a second signal level range based on the information provided from the PVT sensing unit 827, and may use the same to adjust the second signal.

Accordingly, an embodiment is advantageous in that not only the case in which the LO signal itself is changed by the PVT state, but also a change in the mixer performance can be considered, thereby enabling more precise adjustment of the LO signal level.

Figure 11:
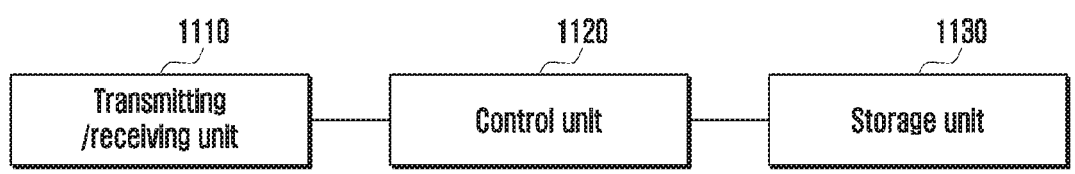
FIG. 11 is a block diagram illustrating a configuration of an electronic device configured to perform a signal level adjustment operation according to various embodiments of the disclosure.

FIG. 11 is a block diagram illustrating a configuration of an electronic device configured to perform a signal level adjustment operation according to various embodiments of the disclosure.

Referring to FIG. 11, an electronic device is illustrated and may be any device capable of performing a signal level adjustment operation according to an embodiment. For example, the electronic device may include user equipment (UE) capable of transmitting/receiving wireless signals with an external device in a wireless communication system, a mobile station (MS), an eNode B (or base station), a transmitting/receiving device, a radar, and the like.

The electronic device according to an embodiment may include a transceiver 1110, a controller 1120, and a memory 1130.

The transceiver 1110 according to an embodiment may transmit/receive wireless signals with an external device. To this end, the transceiver 1110 may include an RF transmitter for up-converting and amplifying the frequency of a signal to be transmitted, an RF receiver for low-noise-amplifying a received signal and down-converting the frequency thereof, and the like. The transceiver 1110 may also include a mixer, an oscillation unit, and a signal level control unit for signal level control according to an embodiment.

The controller 1120 according to an embodiment may control a series of processes for operation of the electronic device. For example, the controller 1120 may control the transceiver 1110 such that wireless signals are transmitted/received through the transceiver 1110.

The memory 1130 according to an embodiment may store a default program, an application program, configuration information, data, and the like for operation of the electronic device according to an embodiment. For example, the memory 1130 may store a lookup table for determining the range of a signal level according to an embodiment.

Those skilled in the art can appreciate that it is possible to implement the disclosure in another specific form without changing the technical idea or the indispensable characteristics of the disclosure. Accordingly, it should be understood that the embodiments described above are merely and are not limited. The scope of disclosure is defined by the appended claims to be described later, rather than the detailed description. Accordingly, it should be appreciated that all modifications or variations derived from the meaning and scope of the appended claims and their equivalents are included in the range of the disclosure.

While the disclosure has been shown described with reference to various embodiments thereof, it will be understood by those skilled in the art that various changes in form and details may be made therein without departing from the spirits and scope of the disclosure as defined by the appended claims and their equivalents.

What is claimed is:

1. An electronic device in a wireless communication system, the electronic device comprising:
    an oscillator configured to output a local oscillator (LO) signal;
    a mixer configured to convert a frequency band of a first signal based on the LO signal and output a second signal; and
    a signal level controller coupled between the oscillator and the mixer,
    wherein the signal level controller comprising a process, voltage, and temperature (PVT) sensor configured to:
        sense a state of the mixer using the PVT sensor,
        identify a first PVT state corresponding to the sensed state of the mixer among a plurality of PVT states in a lookup table, based on first information on a process of the mixer, second information on a temperature of the mixer, and third information on a voltage of the mixer,
        determine a range of a signal level corresponding to the first PVT state based on the lookup table, wherein the lookup table includes ranges of signal levels corresponding to the plurality of PVT states,
        identify a level change of the LO signal based on a second PVT state of the LO signal, and
        output a feedback signal to the oscillator to adjust a magnitude of the LO signal to be within the determined range of the signal level corresponding to the first PVT state, based on the identified level change of the LO signal.

2. The electronic device of claim 1, wherein the signal level controller comprises:
    a coupler connected between the oscillator and the mixer to extract the LO signal;
    an envelope detector configured to detect an envelope based on the second PVT state of the LO signal; and
    a signal control circuit configured to determine the magnitude of the LO signal based on the envelope, and generate the feedback signal based on the envelope and the determined range of the signal level.

3. The electronic device of claim 2, wherein the signal level controller further comprises:
    a first converter, connected between the envelope detector and the signal control circuit; and
    a second converter, connected between the signal control circuit and the oscillator.

4. The electronic device of claim 1, wherein the signal level controller is further configured to:
    output the feedback signal for adjusting the LO signal, and
    if an adjusted LO signal is received from the oscillator in response to the feedback signal, determine whether to adjust the feedback signal for readjusting the LO signal.

5. The electronic device of claim 4, wherein, when a range of the adjusted LO signal is within a preconfigured signal level, the signal level controller is further configured to omit output of the feedback signal.

6. The electronic device of claim 4, wherein, when a range of the adjusted LO signal is outside of a preconfigured signal level, the signal level controller is further configured to output the feedback signal to the oscillator.

7. The electronic device of claim 1, further comprising a buffer configured to amplify the LO signal.

8. A method of an electronic device in a wireless communication system, the method comprising:
    generating a local oscillator (LO) signal;
    sensing a state of a mixer using a PVT sensor;
    identifying a first process, a voltage, and a temperature (PVT) state corresponding to the sensed state of the mixer among a plurality of PVT states in a lookup table, based on first information on a process of the mixer, second information on a temperature of the mixer, and third information on a voltage of the mixer;
    determining a range of a signal level corresponding to the first PVT state based on the lookup table, wherein the lookup table includes ranges of signal levels corresponding to the plurality of PVT states;
    identifying a level change of the LO signal based on a second PVT state of the LO signal;
    outputting a feedback signal to the oscillator to adjust a magnitude of the LO signal to be within the determined range of the signal level corresponding to the first PVT state, based on the identified level change of the LO signal;
    converting a frequency band of a first signal based on the LO signal and the output feedback signal; and
    outputting a second signal corresponding to the first signal having a converted frequency band.

9. The method of claim 8, further comprising:
extracting a coupled LO signal using a coupler,
wherein the outputting the feedback signal further comprises detecting an envelope based on the second PVT state of the LO signal, determining the level change of the LO signal based on the envelope, and generating the feedback signal based on the envelope and the determined range of the signal level.

10. The method of claim 9, further comprising:
converting the envelope into digital samples; and
converting the digital samples into the feedback signal.

11. The method of claim 8, further comprising:
outputting the feedback signal for adjusting the LO signal; and
if a LO signal is received in response to the feedback signal, determining whether to adjust the feedback signal for readjusting the LO signal.

12. The method of claim 11, further comprising:
determining whether the LO signal is adjusted to be within a predetermined range based on an extrapolation from a coupled LO signal; and
when the LO signal is within the predetermined range, omitting output of the feedback signal to maintain a magnitude of the LO signal.

13. The method of claim 11, further comprising:
determining whether the LO signal is adjusted to be within a predetermined range based on an extrapolation from a coupled LO signal; and
when the LO signal outside of the predetermined range, outputting the feedback signal to adjust a magnitude of the LO signal.

14. The method of claim 8, further comprising amplifying the LO signal.

* * * * *